Sept. 27, 1960 R. W. BRADMILLER 2,954,527

SINGLE TRANSISTOR THRESHOLD CIRCUIT

Filed Oct. 2, 1959

RICHARD W. BRADMILLER
INVENTOR.

BY Hurvitz & Rose

ATTORNEYS

United States Patent Office 2,954,527

Patented Sept. 27, 1960

2,954,527

SINGLE TRANSISTOR THRESHOLD CIRCUIT

Richard W. Bradmiller, Winter Park, Fla., assignor to Avco Corporation, Cincinnati, Ohio, a corporation of Delaware Filed Oct. 2, 1959, Ser. No. 843,970

10 Claims. (Cl. 328—195)

The present invention relates generally to threshold and filter circuits, and more particularly to threshold circuits having utility as self-regulated gating circuits, filter circuits having sharp filter action, and active filter circuits having amplitude gating characteristics.

Briefly describing a preferred embodiment of the present invention, the circuit includes an oscillator, the operation of which is controllable by either an externally applied D.C. signal or an externally applied A.C. signal. The oscillator may be of any of a wide variety and may operate over a wide range of frequencies. The circuit including the oscillator may act as a gate or threshold device, provided the frequency sensitive element of the oscillator is sufficiently removed in frequency from the frequency of the externally applied signal to avoid interaction. The oscillator may be normally inactive, and may be brought to an oscillating state in response to the externally applied signal, the latter developing suitable control potential in a diode-capacitor network. While the oscillator is active the externally applied control signal is gated through the amplifying element of the oscillator and recovered at the output of the oscillator. By virtue of the self-oscillating nature of the network, either no signal output is provided in response to low level input signals, or proportional output is provided after a threshold level has been attained by the externally applied signal. Gating on will occur at one level of externally applied signal, and gating off will occur at another and lower level, due to the tendency of the oscillator to remain in oscillation, once oscillations have started.

In a particular embodiment of the present invention a transistor oscillator is employed as the gating element, externally applied signal being applied to the base-emitter circuit of the transistor. A single diode is connected in shunt to the signal source, biased to limit bias excursions in one sense, the base-emitter diode provided by the transistor providing limiting for the opposite signal sense.

The circuit of the invention may operate as a filter, or frequency gate, having sharp filtering action, by tuning the oscillator to approximately the center frequency of a desired pass-band. In such case, only signals falling within the pass-band of the frequency selective circuit of the oscillator are gated to the output, and for frequencies only slightly outside this pass-band, output decreases rapidly to zero. When employed as a filter, moreover, the circuit of the present invention may exhibit amplitude gating properties, i.e., applied input signals are required to exceed a threshold value before output signal appears.

For continuously applied signals the oscillator may be maintained in free-running condition, providing an output the amplitude of which is a direct function of input amplitude. For intermittent input signals normally quiescent operation of the oscillator is preferred, each input signal initiating oscillation as it arrives.

Very narrow pass band filtering action may be achieved by means of the present invention, by providing control of the positive feed-back of the filter loop, the Q of the system being dependent on loop gain and over-all system Q. Since circuit band-width may be narrowed, the present invention may be employed to enhance crystal characteristics as filter elements.

Reasonable isolation is provided between signal and control sources provided frequencies are sufficiently removed. The circuit is free from integrating and differentiating action, and is positive in its action, i.e., once in gating condition it tends to remain in gating condition for signal at the gating level, requiring a signal at considerably below the gating level to effect drop-out. Switching time for circuits according to the invention may be short, and specifically, with suitable design, may be less than one microsecond.

It is accordingly a broad object of the present invention to provide a novel threshold circuit.

It is another object of the present invention to provide a novel active filter comprising an oscillator, to an input terminal of which may be applied an input signal of frequency adjacent to the free-running oscillatory frequency of the oscillator.

A further object of the present invention resides in the provision of a high speed gating circuit comprising a normally quiescent self-oscillatory circuit having a frequency non-adjacent to the frequency of a signal to be gated, the latter when applied at or above a threshold level setting the oscillator into self-oscillations, in which condition the input signal is transferred to an output terminal.

It is a further object of the present invention to provide a regenerative circuit operating under oscillatory conditions as a band pass filter having steep skirts.

A further object of the invention resides in the provision of a gating circuit which becomes conductive in response to a signal above a threshold level, and thereafter becomes non-conductive only if the signal falls appreciably below that threshold level.

Another object of the invention relates to the provision of an amplitude gated filter, which passes only signals having an amplitude above a predetermined threshold level and a frequency falling within a predetermined pass band.

Still another object of the present invention is to provide a system of gating which is automatically self-regulating in respect to gated signal level, providing an output amplitude which is a direct function of input amplitude, for values of amplitude above a threshold level, but in which input levels or excursions are limited between predetermined values.

It is another object of the present invention to provide an active filter capable of enhancing the selectivity and sharpness of cut-off of filter circuits, including piezoelectric crystal filter circuits.

It is still another object of the invention to provide a novel active crystal filter, which may have a selectivity greater than that of the crystal itself.

The above and still further objects, features and advantages of the present invention will become apparent upon consideration of the following detailed description of one specific embodiment thereof, especially when taken in conjunction with the accompanying drawings, wherein.

Figures 1, 2, 3, 4:
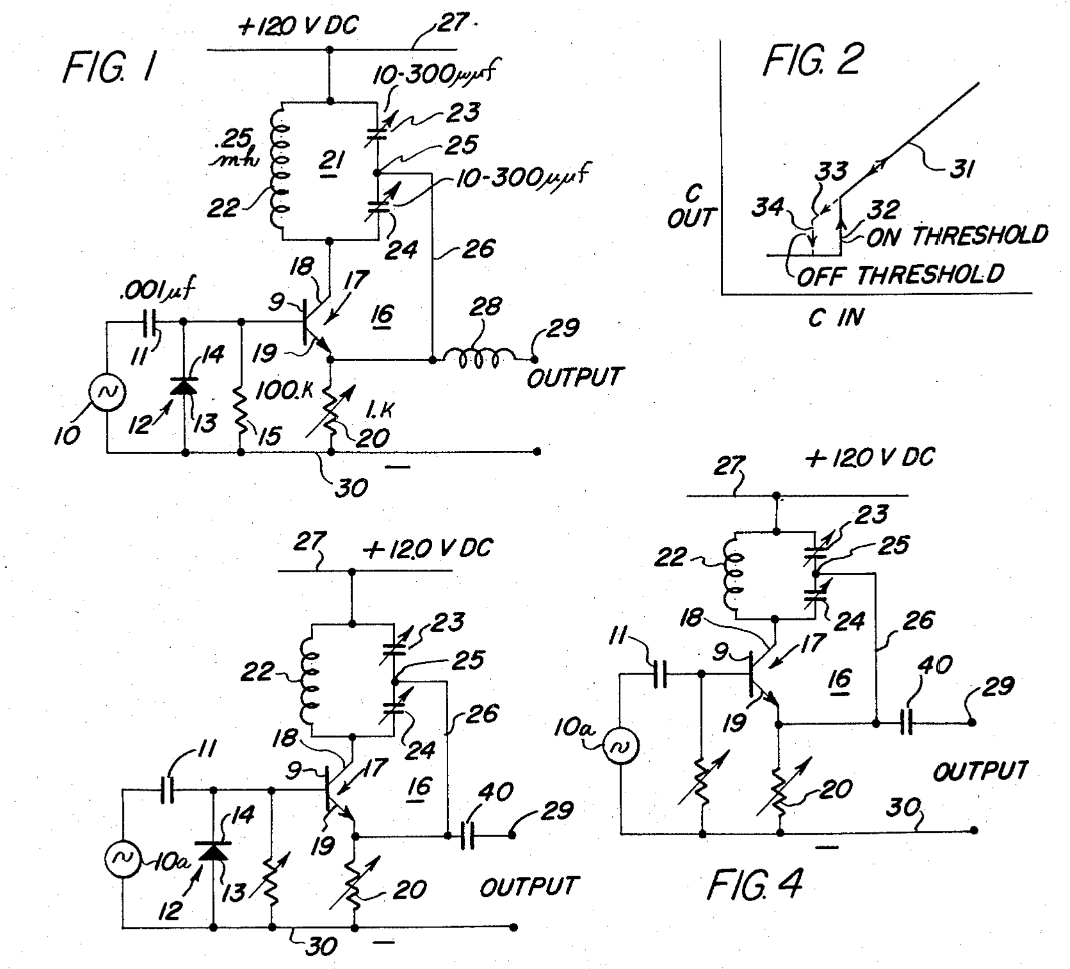
Figure 1 is a schematic circuit diagram of an embodiment of the invention.
Figure 2 is a plot of input versus output signal amplitude, exemplary of the response characteristic of the system of Figure 1.
Figure 5:
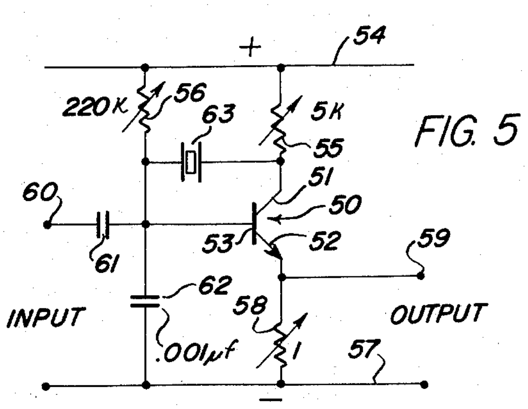

Figures 3–5, incl., are circuit diagrams of modifications of the system of Fig. 1.

Referring now more particularly to the accompanying drawings, the reference numeral 10 denotes a source of A.C. signal, which may be intermittent or steady, and which may have variable amplitudes, i.e., values variable, above and below a predetermined value, and a predetermined frequency. The source 10 is connected via a coupling capacitor 11 across a diode 12, having an anode 13 and a cathode 14. Across the diode 12 is connected a relatively high resistance 15.

An oscillator 16 is provided, having as its active element a NPN transistor 17, the latter including a collector 18, an emitter 19 and a base 9. The cathode 14 is directly connected to the base 9 of transistor 17, and the emitter 19 is connected via a relatively small (1K) variable resistance 20 to the anode 13 of the diode 12.

A tank circuit 21 comprises an inductance 22 in shunt with series connected variable capacitors 23 and 24. The junction 25 of the capacitors 23 and 24 is connected by a lead 26 directly to the emitter 19. The tank circuit 21 is connected between a positive voltage supply lead 27 and the collector 18 of transistor 17. The lead 26 provides regenerative feed-back from the tank circuit 21 to the emitter 19. The resistance 20, however, develops a D.C. bias which maintains the transistor 17 in near cut-off condition, and the oscillator in a quiescent state.

A choke 28 for oscillator frequency is connected between emitter 19 and an output terminal 29.

Assuming that the frequency of signal source 10 is far lower than the natural frequency of the tank circuit 21, a relatively small signal amplitude may be inadequate to upset the static condition of the system. As the signal increases in amplitude, rectified current provides charge for condenser 11, driving a base 9 positive until the oscillator becomes oscillatory. At this point, the oscillator 16 breaks into weak oscillations, which has the effect of reducing the bias on emitter 19, and thus increasing the intensity of oscillations. The process is cumulative, and it requires a very short time for oscillations to build up to full magnitude.

The signal provided by source 10 rides on the D.C. bias provided by the capacitor 11, due to its charge, and appears as an A.C. signal between base 9 and ground at 30, whereupon the transistor 17 transfers signal to the output terminal 29, via choke 28, the transistor circuit being then an emitter follower. The choke 28 is designed to block oscillator current, but not signal current.

Once the transistor has become operative as an oscillating amplifier, output signal amplitude is a direct function of input signal amplitude, as indicated by the portion 31 of the graph of Figure 2 of the accompanying drawings. The portion 32 of the graph indicates the signal amplitude for which an output current is established very rapidly, as input signal level reaches a threshold value for the system. It may be noted that a decrease of signal level is required to a value below the original threshold level for which the system was gated on, to effect closure of the gate. The gate closure characteristic of the system is indicated at 33, signal amplitude in and out decreasing initially along line 31, but passing beyond the "on" threshold value 32 before an "off" threshold is attained at 34.

The system gates off in response to a smaller signal than is required to gate the system on, due to the tendency of the oscillator to remain oscillatory once oscillations have been initiated.

The system of Figure 1 includes a diode 12 across the input circuit of transistor 17, and the base-to-emitter circuit of transistor 17 constitutes a second diode, the two diodes being oppositely poled. Diode 12 serves as a clamping diode to develop a D.C. bias which maintains an oscillating and amplifying condition. There is thus established a self-regulating limiting action at the input of the system, which is directly controlled by the current gain characteristics of the amplifier. Adjustment of bias and level areas of gating is accomplished by adjustment of resistance 20, while limiting action is a function of effective loading of the transistor, i.e., as established primarily by values of resistances 15 and 20. The diodes in combination, being oppositely poled across the input signal, serve to limit the bias excursion of the oscillating amplifier as dictated by the R.F. amplitude.

The fact that the gating levels are different for on and off gating, respectively, and lower for the latter, is advantageous. In many prior art limiters gating on and off occurs at the same level. This property renders such limiters inherently unstable for signals adjacent to the threshold level, since gating on by a signal just at threshold level may tend to change the gating circuit sufficiently to cause off gating, with consequent flutter of the gate. In the system of Figure 1, once the threshold level has been attained and the circuit gated on, it remains gated on until the signal level has decreased very appreciably below the level for which on gating occurred.

The system of Figure 1 may be modified to provide a filter, or an amplitude gated filter, essentially by omission of choke 28 and by substitution of a coupling capacitor therefor, and by tuning the tank circuit 21 to the frequency of source 10. A typical such system is illustrated in Figure 3 of the accompanying drawings.

Identical components in Figures 1 and 3 are identified by the same numerals of reference, the output coupling and D.C. blocking condenser being identified, in Figure 3, by the reference numeral 40 and the A.C. signal course by the reference numeral **10*a***.

The extent of positive feed-back provided by lead 26, the loading of the oscillator 16 provided by resistances 15 and 20, and the static bias provided by the resistance 20 in series with the emitter 19, may be adjusted to bring the oscillator near but not to a state of oscillation, even when the bias provided by the charge on condenser 11 is taken into account. In such case the oscillator 16 may be subject to synchronization in response to signal provided by source **10*a*, so long as the latter is adequately large. It is a well known characteristic of oscillators that they tend to synchronize with any oscillation of approximately the natural frequency of the oscillator. So long as the natural frequency of the oscillator 16 equals the frequency of the signal provided by source 10*a*, and assuming the latter to be of adequate amplitude, the oscillator will continue to oscillate, and output signal will be available at terminal 29**.

As the frequency of input signal departs from the natural frequency of oscillator 16, the latter tends to follow. In so doing the amplitude of oscillations decreases, since the oscillator then operates on one side of the resonance curve of the tank circuit 21. In due course a failure of synchronization occurs, oscillations cease, and signal output also ceases. The latter effect occurs for a slight change in frequency, whereby the band-pass or selectivity characteristic of the system may be said to possess very sharp or nearly vertical skirts.

The system of Figure 3 is a frequency gate, passing signals of frequencies falling between accurately predetermined limits centered on the resonant frequency of the tank circuit 21, and cutting off completely outside those limits.

The system of Figure 3 may be adjusted to be free-running, if the input signal supplied by source **10*a* is continuous. On the other hand the circuit is preferably adjusted to be quiescent in the absence of input signals if the latter are intermittent. In either case, the system may be arranged to be amplitude sensitive, i.e., to provide an output signal proportional to input signal, since amplifying characteristics of the system are utilized. A threshold for amplitude level may also be provided, adjustment of the system in these respects depending on values of resistances 15 and 20** and on the level of D.C. voltage supply.

The selectivity of the system is a function of Q of the tank circuit per se, and on the gain of the feed-back loop. Very narrow pass bands may be attained, i.e., the pass-bands appropriate to the tank circuit per se may be radically reduced, due to the presence of regenerative feed-back in the circuit.

The diode 12 may be omitted, if desired, as in the system of Figure 4, which in all other respects corresponds with Figure 3. Omission of the diode 12 eliminates amplitude gating functions in the system of Figure 3, without affecting operation as a frequency gate, by maintaining relatively constant the bias on the base 9 for all levels of input signal.

In the system of Figure 5 is illustrated a crystal oscillator, operative as an active filter, and in which the filter possesses a higher Q factor than is the case for the crystal itself.

In the system of Figure 5, the NPN transistor 50 includes a collector 51, an emitter 52 and a base 53. The collector 51 is connected to a positive voltage supply lead 54 via a variable resistance 55 (5K). The base 53 is connected to positive voltage supply lead 54 via a variable resistance 56 (220K). Emitter 52 is connected to a negative or ground lead 57 via a resistance 58, and an output terminal 59 is directly connected to the emitter 52. Input signal is applied between terminal 60 and the lead 57, coupling condenser 61 being provided intermediate terminal 60 and base 53 of transistor 50. A small condenser 62 (.001 $\mu$f.) is also provided between base 53 and negative or ground lead 57.

Interconnecting the collector 51 and the base 53 is a piezo-electric crystal 63, provided with the usual electrodes. The circuit configuration of Figure 5 is that of an oscillator, the frequency of which is that for which maximum coupling exists between the collector 51 and the base 53, i.e., the frequency for which the crystal 63 looks electrically like a series circuit. At this frequency regenerative feed-back exists between collector 51 and base 53, which may be arranged to be just inadequate to sustain self-oscillations in the absence of synchronizing oscillations applied to terminal 60. In the presence of such oscillations output signals appear at output terminal 59, having amplitude proportional to the input signal amplitude. The Q of the system is then considerably higher than the Q of the crystal 63, considered per se and apart from the system, because of the positive feed-back available in the system. It is system Q which establishes the selectivity of the system as seen at input terminal 60, so that the present system may be employed to attain selectivities beyond those attainable with crystal filters. Since oscillations terminate abruptly when the drive signal frequency departs sufficiently from the resonant frequency of the crystal 63, the skirts of the filter characteristic provided by the system of Figure 5 are sharp, and in this respect not analogous to the skirt characteristics of passive filters. The gain of the system and its band width may be adjusted by adjusting one or more of the resistances 55, 56, 58.

While I have described and illustrated one specific embodiment of my invention, it will be clear that variations of the details of construction which are specifically illustrated and described may be resorted to without departing from the true spirit and scope of the invention as defined in the appended claims.

What I claim is:

1. In combination, a transistor having a collector, a base and an emitter, a tank circuit, a first voltage supply lead, means connecting said tank circuit between said first voltage supply lead and said collector, a further voltage supply lead, a first impedance connected between said further voltage supply lead and said emitter, a regenerative feed-back coupling between said tank circuit and said emitter, an output terminal coupled to said emitter, means for coupling an input signal between said base and said further voltage supply lead, and a second impedance connected between said base and said further voltage supply lead, said transistor being biased by said impedances to a non-oscillatory condition immediately adjacent to self-oscillation in response only to feed-back provided by said feed-back coupling.

2. The combination according to claim 1 wherein said first impedance is a relatively small resistance and wherein said second impedance includes relatively large resistance connected directly between said base and said further voltage supply lead.

3. The combination according to claim 1 wherein said first impedance is a relatively small resistance and wherein said second impedance includes relatively large resistance connected directly between said base and said further voltage supply lead, and wherein is further provided a diode in shunt to said second impedance, said diode being poled to increase the current gain of said transistor in response to increase of amplitude of said input signal.

4. In combination, a transistor circuit including a transistor having a collector, an emitter and a base, a frequency sensitive circuit coupling said collector to one of said emiter or base, a load impedance connected between said emitter and a point of reference potential, external signal input terminals, one of said signal input terminals being connected to said point of reference potential, means coupling the other of said signal input terminals to said base, and a source of supply and bias voltage for said transistor, said transistor circuit being arranged to operate normally immediately adjacent to but not in a self-oscillatory condition, and to become oscillatory in response only to externally applied signal supplied to said external signal input terminals.

5. The combination according to claim 4 wherein said frequency sensitive circuit is a piezo-electric filter.

6. The combination according to claim 4 wherein said frequency sensitive circuit is a piezo-electric filter connected between said collector and said base, and wherein the frequency of said externally applied signal falls within the pass band of said piezo-electric filter.

7. The combination according to claim 4 wherein said transistor circuit is arranged to be quiescent in absence of said external signal and to be self-oscillatory in response to said external signal only when said external signal has attained a predetermined amplitude.

8. The combination according to claim 4 wherein said transistor circuit is arranged to be quiescent in absence of said externally applied signal and to be self-oscillatory in response to said externally applied signal only when said externally applied signal attains a predetermined amplitude, said externally applied signal having a frequency falling within the pass band of said frequency sensitive circuit.

9. The combination according to claim 4 wherein said transistor circuit is arranged to be quiescent in the absence of said externally applied signal and to be self-oscillatory in response to said externally applied signal only when said external signal attains a predetermined amplitude, said externally applied signal having a frequency falling outside the pass-band of said frequency sensitive circuit, an output circuit coupled to said transistor, and a frequency sensitive device in said output circuit arranged to pass the frequency of said externally applied signal and to reject the frequency of self-oscillation of said transistor circuit.

10. The combination according to claim 9 wherein is provided a diode in shunt between said base and said emitter, said diode being poled oppositely to the effective diode provided by the base-to-emitter circuit of said transistor.

References Cited in the file of this patent

UNITED STATES PATENTS

| | | |
|---|---|---|
| 2,863,995 | Chow | Dec. 9, 1958 |
| 2,921,196 | Chow | Jan. 12, 1960 |